(12) United States Patent
Shioyama

(10) Patent No.: US 6,738,292 B2
(45) Date of Patent: May 18, 2004

(54) NONVOLATILE SEMICONDUCTOR STORAGE DEVICE

(75) Inventor: Kazutomo Shioyama, Sakai (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 74 days.

(21) Appl. No.: 10/183,659

(22) Filed: Jun. 25, 2002

(65) Prior Publication Data

US 2003/0012073 A1 Jan. 16, 2003

(30) Foreign Application Priority Data

Jun. 26, 2001 (JP) .................................. 2001-192711

(51) Int. Cl.[7] .............................................. G11C 16/00
(52) U.S. Cl. ............................. 365/185.23; 365/185.25
(58) Field of Search ....................... 365/185.23, 185.25, 365/185.27, 185.18, 189.11, 226

(56) References Cited

U.S. PATENT DOCUMENTS 6,424,570 B1 * 7/2002 Le et al. ............... 365/185.18
6,538,930 B2 * 3/2003 Ishii et al. ............ 365/185.27
6,608,782 B2 * 8/2003 Hirano .................. 365/185.23

OTHER PUBLICATIONS

Lin, H. et al. (1999). "Novel High Positive and Negative Pumping Circuits for Low Supply Voltage," IEEE International Symposium on Circuits and Systems 1:1238–1241.

* cited by examiner

Primary Examiner—Tan T. Nguyen
(74) Attorney, Agent, or Firm—Morrison & Foerster LLP

(57) ABSTRACT

A nonvolatile semiconductor storage device, comprising: a plurality of memory blocks, and at least one high voltage generation circuit, wherein the high voltage generation circuit is formed by a plurality of stages of basic pump cells, each basic pump cell including, a voltage increasing capacitor, an equalizing transistor connected to a voltage of a previous basic pump cell stage, a capacitor for increasing a voltage at a gate of the equalizing transistor, and a transistor which connects the voltage of the previous basic pump cell stage to the gate of the equalizing transistor, the nonvolatile semiconductor storage device further comprises, a discharge circuit connected to a node in the high-voltage generation circuit which has a high voltage, for discharging the node to a potential equal to or lower than a power supply voltage when the high-voltage generation circuit is stopped, and a control circuit for controlling the discharge circuit.

16 Claims, 5 Drawing Sheets

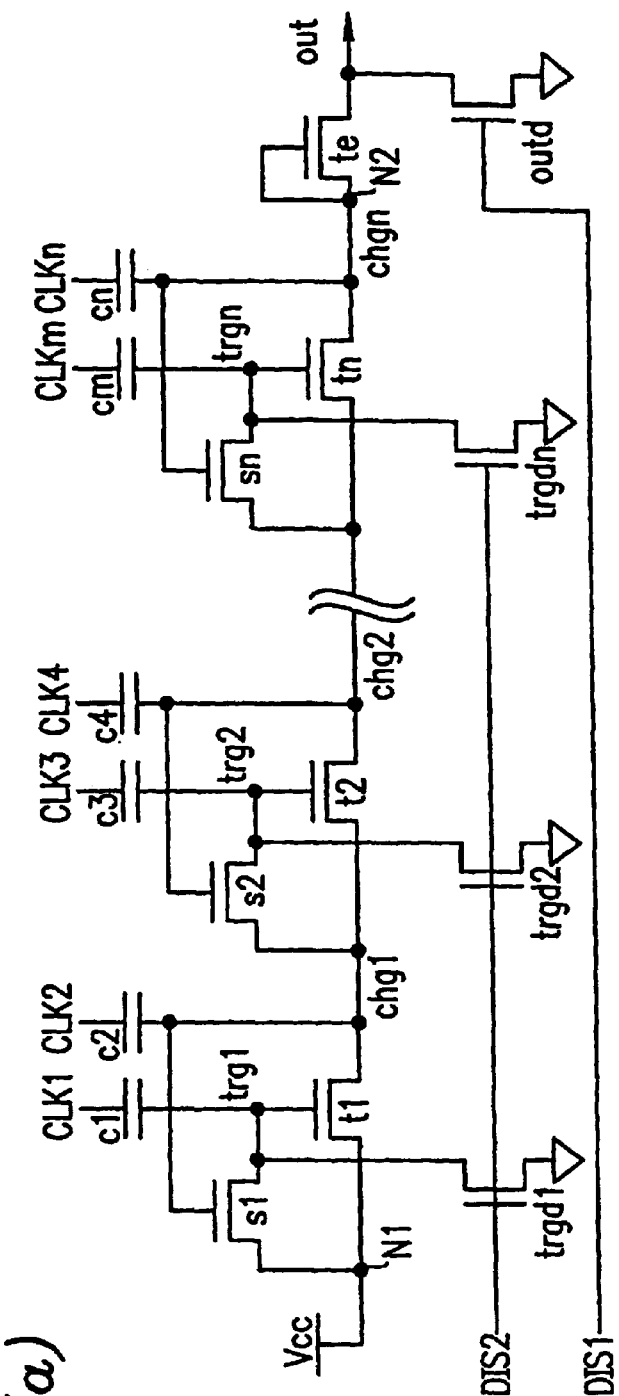
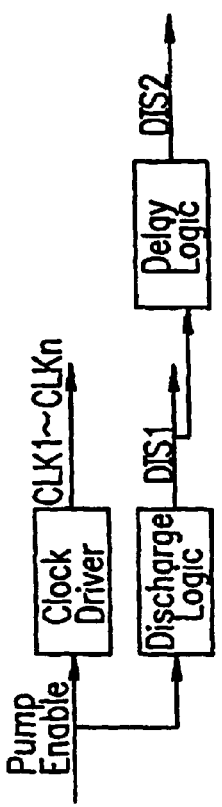
FIG.2(b)
FIG.2(a)

NONVOLATILE SEMICONDUCTOR STORAGE DEVICE

BACKGROUND OF THE INVENTION

1. Field of the Invention

The present invention relates to a nonvolatile semiconductor storage device, such as a flash memory device. More specifically, the present invention relates to a nonvolatile semiconductor storage device capable of reducing a stress of a peak inverse voltage which may be caused due to a high voltage applied inside of a high-voltage generation circuit.

2. Description of the Related Art

In general, a flash memory device has electrical writing and erasing functions. Many flash memories incorporate a high-voltage generation circuit (hereinafter, referred to as a pump circuit) for generating a high voltage, which is necessary for writing and erasing operations.

Hereinafter, such a conventional flash memory is described with reference to FIG. 3. The conventional flash memory device shown in FIG. 3 includes a plurality of memory blocks B1, B2, . . . , which have identical structures. Each of the memory blocks B1, B2, . . . , includes a memory array M1. The memory array M1 includes a plurality of word lines WL and a plurality of bit lines BL, which are arranged so as to cross each other (in this example, at right angles) such that each memory cell S can be selected. Each word line WL is connected to a gate of a memory cell S, and each bit line BL is connected to a drain of a memory cell S. Further, the word lines WL are connected to a row decoder XD which selects any of the word lines WL according to a row address input from an external circuit. The bit lines BL are connected to a column decoder YD which selects any of the bit lines BL according to a column address input from an external circuit. Pump circuits PV1 and PV2 are connected to the respective memory blocks B1, B2, . . . , for supplying a voltage necessary for writing or erasing data in a memory array. A voltage generated by the first pump circuit PV1 is supplied to the row decoder XD of each memory block, and a voltage generated by the second pump circuit PV2 is supplied to the column decoder YD of each memory block. In the example described below, the flash memory device includes a plurality of memory blocks B1 and B2. However, the number of memory blocks included in the flash memory device is not limited to two, but may be three or more.

In the above flash memory device, in order to write data in a memory array of each memory block, for example, a voltage of 12 V is generated by the first pump circuit PV1, and the generated voltage is supplied to a certain word line WL through a row decoder XD of a selected block. Concurrently, for example, a voltage of 6 V is generated by the second pump circuit PV2, and the generated voltage is supplied to a certain bit line BL through a column decoder YD of the selected block. As a result, data is written in a memory cell S located at the intersection of the above word line WL and bit line BL.

Hereinafter, the structures of the first pump circuit PV1 and the second pump circuit PV2 are described with reference to FIGS. 4($a$) and 4($b$). Herein, the first pump circuit PV1 and the second pump circuit PV2 have the same structure. Each of the first pump circuit PV1 and the second pump circuit PV2 has multiple stages (n stages) of basic pump cells. As shown in FIG. 4($a$), each pump cell includes a pair of capacitors (c1 and c2; c3 and c4; . . . , cm and cn) and a pair of transistors (s1 and t1; s2 and t2; . . . , sn and tn).

In the basic pump cell of the first stage, a capacitor c1 is a capacitor for increasing the voltage. A capacitor c2, which is also a capacitor for increasing the voltage, receives a clock signal CLK2 at one of its electrodes. The other electrode of the capacitor c2 is connected to a node chg1 which connects the basic pump cell of the first stage to a basic pump cell of a subsequent stage, and is connected to a gate of a transistor s1. With such a structure, the basic pump cell of the first stage increases the potential at the node chg1. A transistor t1 of the first basic pump cell is an equalizing transistor. The source of the equalizing transistor t1 is connected to a node N1 which connects the first basic pump cell to the power supply voltage Vcc of the previous stage. The drain of the equalizing transistor t1 is connected to the node chg1 which connects the first basic pump cell to a basic pump cell of a subsequent stage. With such an arrangement, the first basic pump cell functions as a switch for charging the node chg1 so as to have a potential equal to that of the node N1. The source of the transistor s1 of the first stage basic pump cell is connected to the node N1 which connects the first basic pump cell to the power supply voltage Vcc of the previous stage. The drain of this transistor s1 is connected to a gate of the equalizing transistor t1 at a node trg1 for charging the gate of the equalizing transistor t1. A capacitor c1 of the first stage basic pump cell receives a clock signal CLK1 at one of its electrodes. The other electrode of the capacitor c1 is connected to a gate of the equalizing transistor t1 at the node trg1 for increasing the voltage at the gate of the equalizing transistor t1. Each basic pump cell of the other stages is connected to pump cells of previous and subsequent stages in a similar manner. An output-side node chgn of a basic pump cell of the last stage is connected to a source of a backflow preventing transistor te which prevents a backflow of an electric current. A gate of the backflow preventing transistor te is connected to a node N2 which connects the basic pump cell of the last stage to the backflow preventing transistor te.

In the booster pump circuit having such a structure, in a voltage increasing operation, the clock signals CLK1 and CLK2, which have opposite phases to each other as shown in FIG. 5, are input to the two capacitors c1 and c2 of the first basic pump cell. At the next stage, clock signals CLK3 and CLK4, which have opposite phases to each other, and which have opposite phases to the voltages in the capacitors c1 and c2 of the previous basic pump cell as shown in FIG. 5, are input to the capacitors c3 and c4.

At each of the following stages, a pair of capacitors respectively receive a pair of clock signals, which have opposite phases to each other, and which have also opposite phases to the voltages at a pair of capacitors of a previous basic pump cell. At the last stage, clock signals CLKm and CLKn are input to capacitors cm and cn of the basic pump cell. These clock signals CLK1 through CLKn are generated by a known clock driving circuit ("Clock Driver" in FIG. 4($b$)). The clock driving circuit is controlled based on an activation signal (Pump Enable signal) which is used for activating a pump circuit.

For example, consider a case where power source voltage Vcc is input as an initial potential, and signals which vary between Vcc and Vss, such as clock signals shown in FIG. 5, are input as clock signals. When a clock signal CLK2 is Vcc at a point A of FIG. 5, the voltage at the gate of the transistor s1 is increased to Vcc due to the clock signal CLK2 supplied through the capacitor c2 so that the transistor s1 is turned into a conductive state. As a result, the gate of the equalizing transistor t1 (node trg1) is charged to Vcc.

Thereafter, the phases of the clock signals are inverted at a point B, so that the clock signal CLK1 is transitioned to Vcc. The voltage of the node trg1 is then increased to 2Vcc due to the clock signal CLK1 supplied through the capacitor c1. As a result, the equalizing transistor t1 is turned into a conductive state, so that the node chg1 is charged with the initial potential Vcc, which is a potential difference between the node trg1 and the node chg1.

Thereafter, the phases of the clock signals are inverted at a point C of FIG. 5, so that the clock signal CLK1 is transitioned to Vss. As a result, the equalizing transistor t1 is turned into a non-conductive state. Since the clock signal CLK2 is Vcc in this example, the potential at the node chg1 is increased to 2Vcc due to the clock signal CLK2 supplied through the capacitor c2. Further, since a clock signal CLK3 is Vcc, the potential at the node trg2 is increased due to the clock signal CLK3 supplied through the capacitor c3, so that an equalizing transistor t2 is turned into a conductive state. As a result, a node chg2 is charged with the potential at the node chg1, i.e., 2Vcc.

Next, the phases of the clock signals are inverted at a point D of FIG. 5, so that the clock signal CLK3 is decreased to Vss. As a result, the equalizing transistor t2 is turned into a non-conductive state. Since the clock signal CLK4 is Vcc, the potential at the node chg2 is increased to 3Vcc due to the clock signal CLK4 supplied through the capacitor c4. In this way, the voltage increasing operation is performed at each of the stages from the node chg1 to the node chgn. The electric current of the thus-increased voltage passes through the backflow preventing transistor te for preventing a backflow of the electric current, and then, the high voltage is output from an output node out.

During a time when the pump circuit operates based on the pump enable signal, which is supplied to the clock driving circuit, in order for the flash memory device to perform a write operation or erase operation, a node of a basic pump cell of a later stage, among the nodes chg1 to chgn and the nodes trg1 to trgn, is constantly charged with a higher voltage.

In such a conventional flash memory device, when a node of a basic pump cell is charged with a high voltage, each transistor and each capacitor included in the basic pump cell suffers from increased stress caused by the high voltage, because there is no electrical pathway for reducing the voltage of (i.e., for discharging) the transistor or capacitor. For example, the operational reliability of a pump circuit is adversely influenced by an electrical peak inverse voltage at a junction portion of a substrate on which a transistor is formed and a gate of the transistor, an electrical peak inverse voltage at a junction portion of the substrate and a source-drain of the transistor, an electrical peak inverse voltage caused due to an absolute potential difference which is applied to an insulation film which forms a capacitor, or the like. Accordingly, the operation characteristics of the flash memory device deteriorate. As a result, a desired output voltage cannot be reached during the voltage increasing operation of the pump circuit, or a desired output current cannot be obtained. In such a case, read/write/erase operation characteristics of the flash memory device deteriorate.

SUMMARY OF THE INVENTION

According to one aspect of the present invention, a nonvolatile semiconductor storage device includes: a plurality of memory blocks, each of the memory blocks including, a memory array formed by a plurality of memory cells, a plurality of word lines and a plurality of bit lines, which are provided so as to cross each other and to be connected to the memory cells for selecting among the memory cells, a row decoder for selecting among the word lines according to an externally-input address, and a column decoder for selecting among the bit lines according to the externally-input address; at least one high voltage generation circuit for supplying a voltage which is required in writing data in or erasing data from the memory array, to the memory array through the row and column decoders, wherein the high voltage generation circuit is formed by a plurality of stages of basic pump cells, each of the basic pump cells including, a voltage increasing capacitor for increasing a voltage, an equalizing transistor which is connected to a voltage of a previous basic pump cell stage, a capacitor for increasing a voltage at a gate of the equalizing transistor, and a transistor which connects the voltage of the previous basic pump cell stage to the gate of the equalizing transistor, the nonvolatile semiconductor storage device further comprises, a discharge circuit connected to a node in the high-voltage generation circuit which has a high voltage, for discharging the node to a potential equal to or lower than a power supply voltage when the high-voltage generation circuit is stopped, and a control circuit for controlling the discharge circuit.

In one embodiment of the present invention, the discharge circuit is connected to a junction point between a drain of the equalizing transistor and one electrode of the voltage increasing capacitor, and connected to a gate electrode of the equalizing transistor.

In another embodiment of the present invention, the discharge circuit is connected to the gate electrode of the equalizing transistor.

In still another embodiment of the present invention, the discharge circuit is connected to an output section of the high-voltage generation circuit.

In still another embodiment of the present invention, the control circuit controls a plurality of discharge circuits simultaneously.

In still another embodiment of the present invention, the control circuit includes a delay circuit for delaying a control signal which is used for controlling the discharge circuit; and the control circuit controls the discharge circuit connected to the gate electrode of the equalizing transistor according to an output signal from the delay circuit.

Hereinafter, functions of the present invention are described.

According to the present invention, a discharge circuit including a discharge transistor is connected to each node in a pump circuit of a flash memory device that may suffer from a high voltage. The discharge circuit discharges the node so as to have a low voltage equal to or lower than the power supply voltage Vcc. When the pump circuit is stopped, for example, when the flash memory device is on standby, the discharge transistor is controlled so as to be in a conductive state, whereby the charge of the node having a high voltage is connected to a low voltage side of the pump circuit. As a result, the node is discharged to a potential equal to or smaller that the power supply voltage. When operation of the pump circuit is restarted, the discharge transistor is controlled so as to be in a non-conductive state, whereby the potential at the node is increased. Thus, according to the present invention, the discharge circuit is controlled such that stress on the node, which may be caused due to a high voltage, is reduced, whereby the operational reliability of the pump circuit is improved.

Thus, the invention described herein makes possible the advantages of providing a nonvolatile semiconductor storage device having improved operational reliability, wherein an electric charge retained in each node of a pump circuit is discharged during a time when an operation of the pump circuit is stopped, whereby stress on the pump circuit due to high voltage is reduced.

These and other advantages of the present invention will become apparent to those skilled in the art upon reading and understanding the following detailed description with reference to the accompanying figures.

BRIEF DESCRIPTION OF THE DRAWINGS

FIGS. 2(*a*) and 2(*b*) show a general structure of a pump circuit of a nonvolatile semiconductor storage device according to embodiment 2 of the present invention.

DESCRIPTION OF THE PREFERRED EMBODIMENTS

Hereinafter, embodiments of the present invention will be described with reference to the drawings.
(Embodiment 1)

Figure 1B:
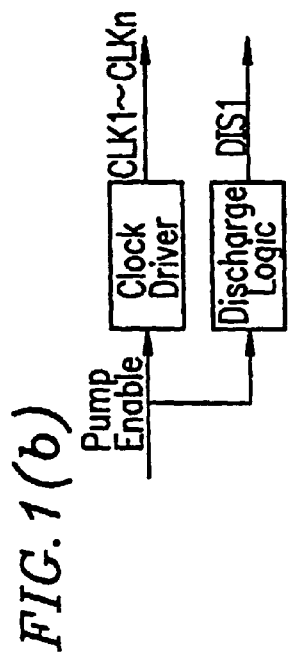
FIGS. 1(*a*) and 1(*b*) show a general structure of a pump circuit of a nonvolatile semiconductor storage device according to embodiment 1 of the present invention.
Figure 1A:
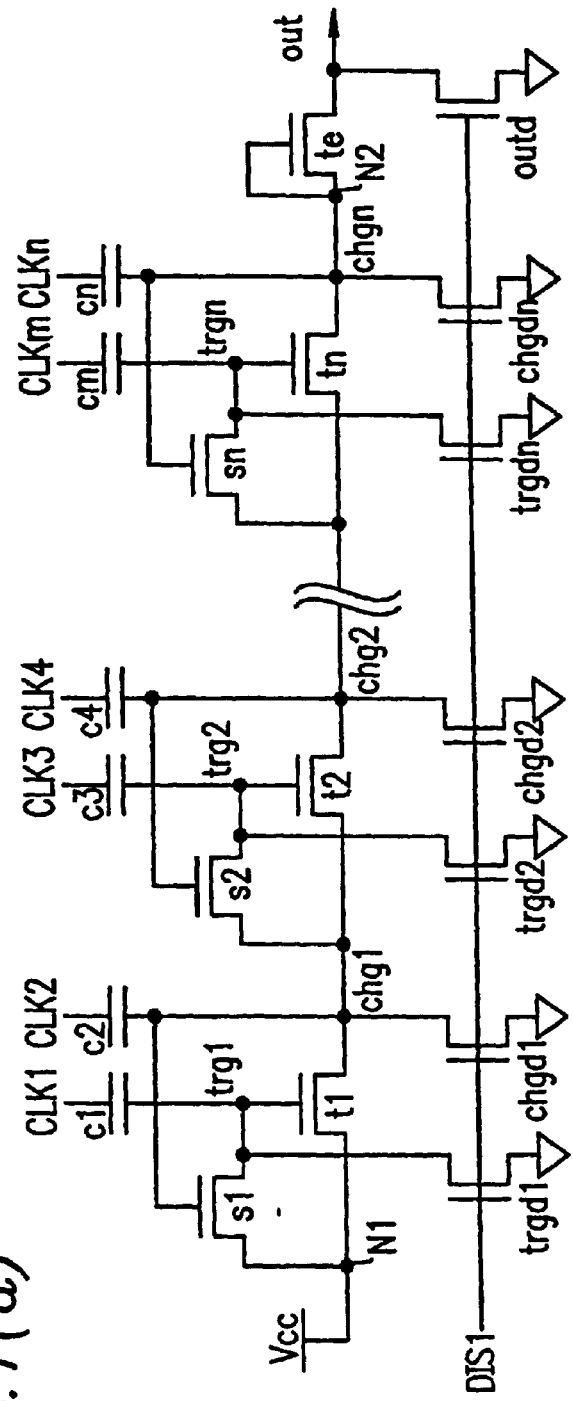

FIG. 1 shows a structure of a pump circuit of a nonvolatile semiconductor storage device according to embodiment 1 of the present invention.

Figure 3:
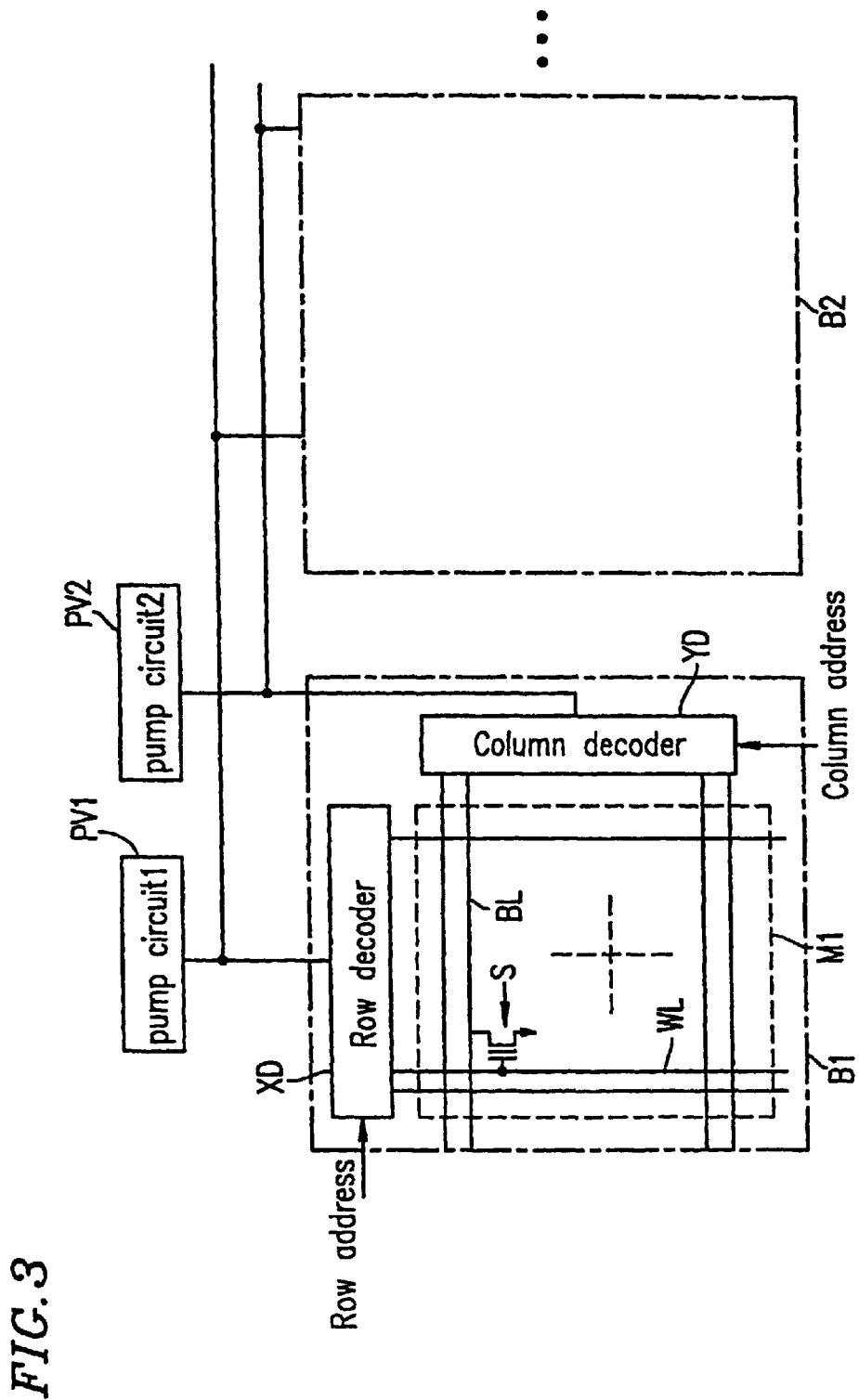
FIG. 3 shows a structure of a common flash memory device.
Figure 4B:
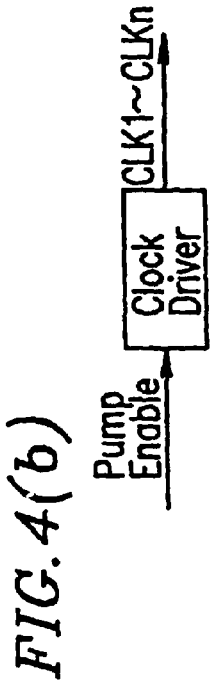
FIGS. 4(*a*) and 4(*b*) show a general structure of a pump circuit of a conventional nonvolatile semiconductor storage device.
Figure 4A:
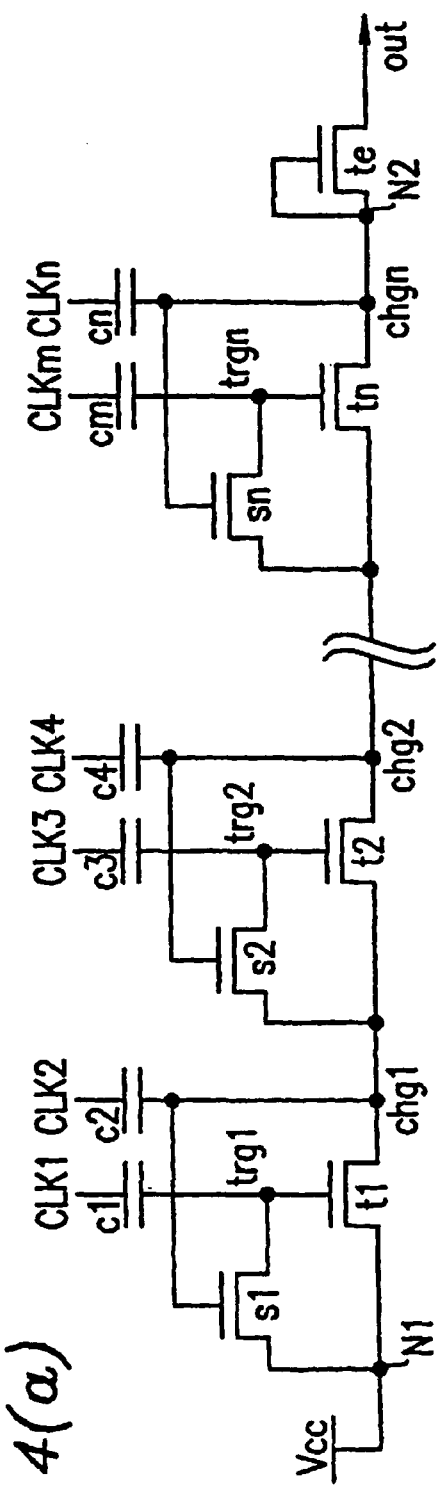

This pump circuit can be used as the pump circuit PV1 and/or the pump circuit PV2 in the flash memory device shown in FIG 3. Each pump circuit has multiple stages (n stages) of basic pump cells. As shown in FIG. 1(*a*), each basic pump cell includes a pair of capacitors (c1 and c2; c3 and c4; . . . , cm and cn) and a pair of transistors (s1 and t1; s2 and t2; . . . , sn and tn).

In the basic pump cell of the first stage, a capacitor c1 is a capacitor for increasing the voltage. A capacitor c2, which is also a capacitor for increasing the voltage, receives a clock signal CLK2 at one of its electrodes. The other electrode of the capacitor c2 is connected to a node chg1 which connects the basic pump cell of the first stage to a basic pump cell of a subsequent stage, and is connected to a gate of a transistor s1. With such a structure, the basic pump cell of the first stage increases the potential at the node chg1. A transistor t1 of the first basic pump cell is an equalizing transistor. The source of the equalizing transistor t1 is connected to a node N1 which connects the first basic pump cell to power supply voltage Vcc of the previous stage. The drain of the equalizing transistor t1 is connected to the node chg1 which connects the first basic pump cell to a basic pump cell of a subsequent stage. With such an arrangement, the first basic pump cell functions as a switch for charging the node chg1 so as to have a potential equal to that of the node N1. The source of the transistor s1 of the first stage basic pump cell is connected to the node N1 which connects the first basic pump cell to the power supply voltage Vcc of the previous stage. The drain of this transistor s1 is connected to a gate of the equalizing transistor t1 at a node trg1 for charging the gate of the equalizing transistor t1. A capacitor c1 of the first stage basic pump cell receives a clock signal CLK1 at one of its electrodes. The other electrode of the capacitor c1 is connected to a gate of the equalizing transistor t1 at the node trg1 for increasing the voltage at the gate of the equalizing transistor t1. Each basic pump cell of the other stages is connected to pump cells of previous and subsequent stages in a similar manner. An output-side node chgn of a basic pump cell of the last stage is connected to a source of a backflow preventing transistor te which prevents a backflow of an electric current. A gate of the backflow preventing transistor te is connected to a node N2 which connects the basic pump cell of the last stage to the backflow preventing transistor te.

According to embodiment 1 of the present invention, as shown in FIG. 1(*a*), in addition to the above structure, each basic pump cell has a discharge transistor (chgd1, chgd2, . . . , chgdn). A low potential which is equal to or lower than Vcc is applied to the source of the discharge transistor (chgd1, chgd2, . . . , chgdn). This discharge transistor is connected to the node (chg1, chg2, . . . , chgn) which is connected to a junction point of the drain of the equalizing transistor (t1, t2, . . . , tn) and one of electrodes of the voltage increasing capacitor (c1, c2, . . . , cn). Further, each basic pump cell further includes a second discharge transistor (trgd1, trgd2, . . . , trgdn). A low potential which is equal to or lower than Vcc is applied to the source of the second discharge transistor (trgd1, trgd2, . . . , trgdn). This discharge transistor is connected to the node (trg1, trg2, . . . , trgn) which is connected to a gate electrode of the equalizing transistor (t1, t2, . . . , tn). Furthermore, a discharge transistor outd is connected to an output node out. A low potential which is equal to or lower than Vcc is applied to the source of the discharge transistor outd.

The gate electrodes of the discharge transistors (trgd1, chgd1, trgd2, chgd2, . . . , trgdn, chgdn, and outd) are connected to a discharge control circuit (Discharge Logic) shown in FIG. 1(*b*). Gate voltage DIS1 is input from the discharge control circuit to the discharge transistors.

In this specification, the "potential equal to or lower than Vcc" is a level of potential such that the characteristics of transistors are not deteriorated due to a high voltage between an increased potential occurring at the source or drain of the equalizing transistor t1 (e.g., 12 V) and a substrate potential (e.g., 0 V). For example, the potential may be equal to or lower than a power supply voltage supplied to peripheral logic circuits other than the memory cell.

Figure 5:
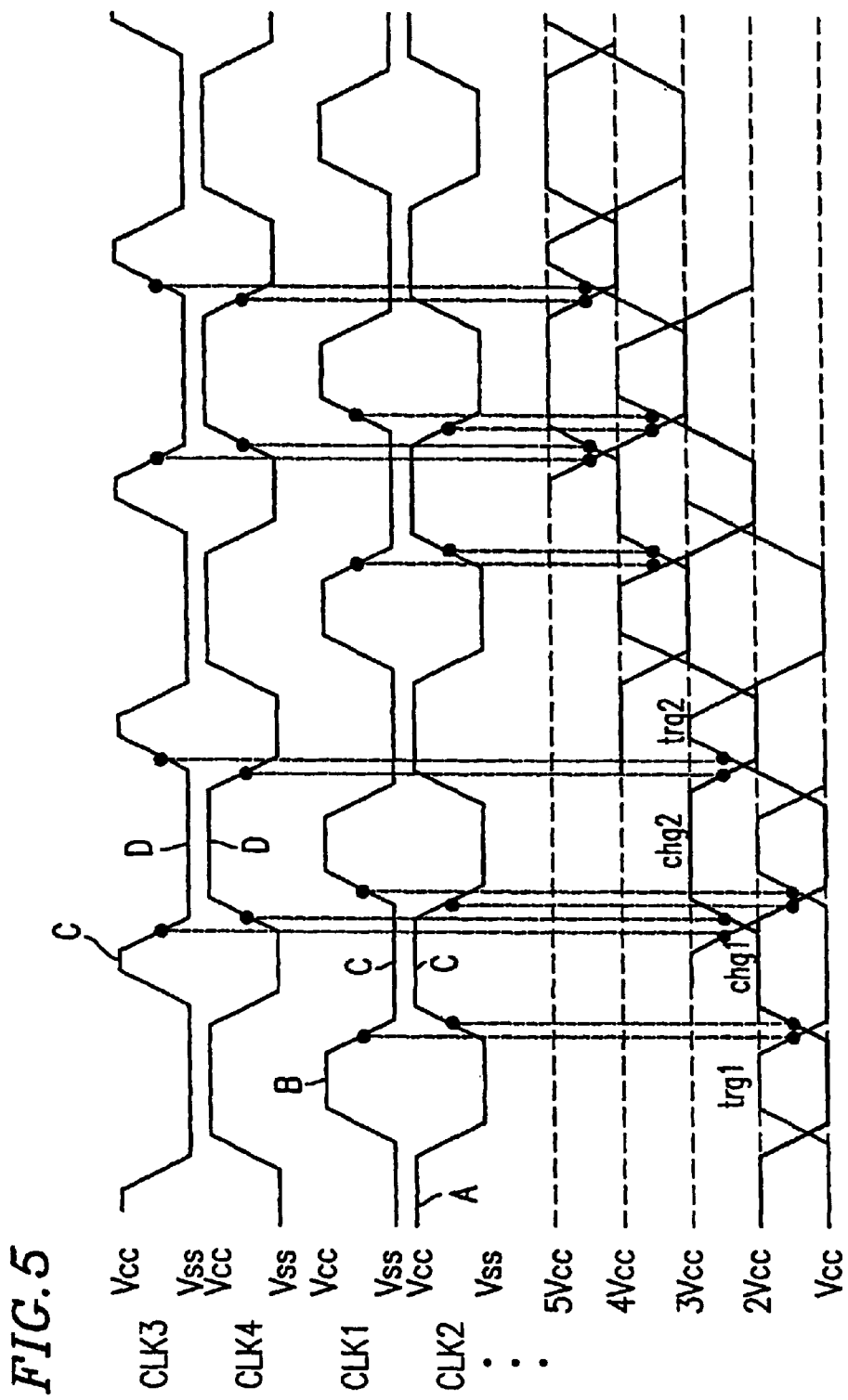
FIG. 5 is a timing chart for illustrating a voltage increasing operation of a common pump circuit.

In the booster pump circuit having such a structure, in a voltage increasing operation, the clock signals CLK1 and CLK2, which have opposite phases to each other as shown in FIG. 5, are input to the two capacitors c1 and c2 of the first basic pump cell. At the next stage, clock signals CLK3 and CLK4, which have opposite phases to each other, and which have opposite phases to the voltages in the capacitors c1 and c2 of the previous basic pump cell as shown in FIG. 5, are input to the capacitors c3 and c4. At each of the following stages, a pair of capacitors respectively receive a pair of clock signals, which have opposite phases to each other, and which have also opposite phases to the voltages at a pair of capacitors of a previous basic pump cell. At the last stage, clock signals CLKm and CLKn are input to capacitors cm and cn of the basic pump cell. These clock signals CLK1 through CLKn are generated by a known clock driving circuit ("Clock Driver" in FIG. 1(*b*)). The clock driving circuit is controlled based on an activation signal (Pump Enable signal) which is used for activating a pump circuit.

For example, consider a case where power source voltage Vcc is input as an initial potential, and signals which vary between Vcc and Vss, such as clock signals shown in FIG. 5, are input as clock signals. When a clock signal CLK2 is Vcc at a point A of FIG. 5, the voltage at the gate of the transistor s1 is increased to Vcc due to the clock signal CLK2 supplied through the capacitor c2 so that the transistor s1 is turned into a conductive state. As a result, the gate of the equalizing transistor t1 (node trg1) is charged to Vcc.

Thereafter, the phases of the clock signals are inverted at a point B, so that the clock signal CLK1 is transitioned to Vcc. The voltage of the node trg1 is then increased to 2Vcc due to the clock signal CLK1 supplied through the capacitor c1. As a result, the equalizing transistor t1 is turned into a conductive state, so that the node chg1 is charged with the initial potential Vcc, which is a potential difference between the node trg1 and the node chg1.

Thereafter, the phases of the clock signals are inverted at a point C of FIG. 5, so that the clock signal CLK1 is transitioned to Vss. As a result, the equalizing transistor t1 is turned into a non-conductive state. Since the clock signal CLK2 is Vcc in this example, the potential at the node chg1 is increased to 2Vcc due to the clock signal CLK2 supplied through the capacitor c2. Further, since a clock signal CLK3 is Vcc, the potential at the node trg2 is increased due to the clock signal CLK3 supplied through the capacitor c3, so that an equalizing transistor t2 is turned into a conductive state. As a result, a node chg2 is charged with the potential at the node chg1, i.e., 2Vcc.

Next, the phases of the clock signals are inverted at a point D of FIG. 5, so that the clock signal CLK3 is decreased to Vss. As a result, the equalizing transistor t2 is turned into a non-conductive state. Since the clock signal CLK4 is Vcc, the potential at the node chg2 is increased to 3Vcc due to the clock signal CLK4 supplied through the capacitor c4. In this way, the voltage increasing operation is performed at each of the stages from the node chg1 to the node chgn. The electric current of the thus-increased voltage passes through the backflow preventing transistor te for preventing a backflow of the electric current, and then, the high voltage is output from an output node out.

When the above pump circuit is in operation, a voltage equal to or lower than Vcc is supplied as the gate voltage DIS1 from the discharge control circuit to the discharge transistors trgd1, chgd1, trgd2, chgd2, . . . , trgdn, chgdn, and outd. As a result, these discharge transistors are placed into a non-conductive state. In this case, the nodes in the pump circuit, trg1, chg1, trg2, chg2, . . . , trgn, chgn, and out, are not discharged.

When the pump circuit is stopped, for example, when the flash memory device is on standby, the pump enable signal is inactivated, so that the clock signals CLK1, CLK2, CLK3, CLK4, . . . , CLKm, and CLKn are stopped being supplied from the clock driving circuit to the respective capacitors. Then, the gate voltage DIS1, which is supplied from the discharge control circuit to the discharge transistors trgd1, chgd1, trgd2, chgd2, . . . , trgdn, chgdn, and outd, is transitioned from a voltage lower than Vcc, which turns the discharge transistors into a non-conductive state, to a voltage equal to or higher than Vcc, which turns the discharge transistors into a conductive state. As a result, the discharge transistors are in the conductive state. Thus, the nodes in the pump circuit, trg1, chg1, trg2, chg2, . . . , trgn, chgn, and out, which have a high voltage due to a voltage increasing operation of the pump circuit, are discharged to a potential equal to or lower than Vcc.

When operation of the pump circuit is restarted, for example, when the flash memory device starts a write operation, the pump enable signal is activated, so that the gate voltage DIS1, which is supplied from the discharge control circuit to the discharge transistors trgd1, chgd1, trgd2, chgd2, . . . , trgdn, chgdn, and outd, is transitioned from a voltage equal to or higher than Vcc, which turns the discharge transistors into a conductive state, to a voltage lower than Vcc, which turns the discharge transistors into a non-conductive state. As a result, the discharge transistors are in the non-conductive state. Thereafter, the clock signals are input from the clock driving circuit to the respective capacitors, and the voltage increasing operation is performed in a trouble free manner.

(Embodiment 2)

FIG. 2 shows a structure of a pump circuit of a nonvolatile semiconductor storage device according to embodiment 2 of the present invention.

In the pump circuit shown in FIG. 2, the structure of a basic pump cell is the same as that of embodiment 1 shown in FIG. 1, except for the position at which a discharge transistor is connected.

In embodiment 2, as shown in FIG. 2(a), discharge transistors trgd1, trgd2, . . . , trgdn, whose sources have a low potential equal to or lower than Vcc, are respectively connected to nodes trg1, trg2, . . . , trgn, which are connected to gate electrodes of the equalizing transistors t1, t2, . . . , tn. Further, a discharge transistor outd, whose source has a low potential equal to or lower than Vcc, is connected to an output node out of the pump circuit.

The gate electrode of the discharge transistor outd is connected to a discharge control circuit (Discharge Logic) shown in FIG. 2(b). Gate voltage DIS1 is input from the discharge control circuit to the discharge transistor outd. The gate electrodes of the discharge transistors trgd1, trgd2, . . . , and trgdn are connected to a delay circuit (Delay Logic), which is connected to the discharge control circuit (Discharge Logic). Gate voltage DIS2, which is generated by delaying an output from the discharge control circuit, is input to the discharge transistors trgd1, trgd2, . . . , and trgdn.

When the above pump circuit is in operation, voltages equal to or lower than Vcc are supplied as the gate voltage DIS1 and the gate voltage DIS2 from the discharge control circuit and the delay circuit, respectively, to the discharge transistor outd and the discharge transistors trgd1, trgd2, . . . , and trgdn, so that all of these discharge transistors are placed into a non-conductive state. In this case, the nodes in the pump circuit, trg1, trg2, . . . . trgn, and out, are not discharged.

When the pump circuit is stopped, for example, when the flash memory device is on standby, the pump enable signal is inactivated, so that the clock signals CLK1, CLK2, CLK3, CLK4, . . . , CLKm, and CLKn are stopped being supplied from the clock driving circuit to the respective capacitors. Then, the gate voltage DIS1, which is supplied from the discharge control circuit to the discharge transistor outd, is transitioned from a voltage lower than Vcc, which turns the discharge transistor outd into anon-conductive state, to a voltage equal to or higher than Vcc, which turns the discharge transistor outd into a conductive state. As a result, the discharge transistor outd is in the conductive state. On the other hand, the voltages at the nodes trg1, trg2, . . . , and trgn, i.e., the voltages at the gates of the equalizing transistors t1, t2, . . . , tn, are maintained at a high voltage. Thus, when the discharge transistor outd is turned into the conductive state, the nodes chg1, chg2, . . . , chgn in the pump circuit, which are at a high voltage, are discharged by the discharge transistor outd through the backflow preventing transistor te until the voltage between both ends of the backflow preventing transistor te turns into an electric current backflow state. After the nodes chg1, chg2, . . . ,chgn have been discharged in this way, the gate voltage DIS2, which is generated by delaying an output from the discharge control circuit and supplied to the discharge transistors trgd1, trgd2, ..., and trgdn, is transitioned from a voltage lower than Vcc, which turns the discharge transistors trgd1, trgd2, ..., and trgdn into a non-conductive state, to a voltage equal to or higher than Vcc, which turns the discharge transistors trgd1, trgd2, ..., and trgdn into a conductive state. As a result, the discharge transistors trgd1, trgd2, ..., and trgdn are in the conductive state, whereby the remaining nodes trg1, trg2, ..., and trgn are discharged to a potential equal to or lower than Vcc.

According to embodiment 2, a time difference is provided between a period during which the gate voltage DIS1 is output and a period during which the gate voltage DIS2 is output, whereby the discharge operation is separated into two stages. In such an arrangement, even in the case where the number of nodes to which discharge transistors are connected is reduced in comparison to embodiment 1, nodes present between pump cells can be discharged. Thus, the circuitry size can be decreased by reducing the number of discharge transistors.

For example, referring to FIG. 2(b), a delay time is calculated based on the capacitance of a capacitor and the amount of an electric current which can be driven by a discharge transistor (electric current performance), and the delay circuit (Delay Logic), which is used for generating the calculated delay time, is connected to the discharge control circuit, whereby a time difference can be provided between a period during which the gate voltage DIS1 is output and a period during which the gate voltage DIS2 is output.

For example, the above delay time can be calculated as follows. Herein, consider an example where each node is discharged to 0 V, for example, through the discharge transistor outd from the output node out. In this example, the discharge time $\Delta t$ for the nodes chg1, chg2, ..., chgn is calculated as follows:

$$(c1v1+c2v2+ \ldots +cnvn)/I$$

where I denotes the amount of an electric current driven by the discharge transistor outd; c1, c2, ..., cn denote the capacitances of the nodes chg1, chg2, ..., chgn, respectively; and v1, v2, ..., vn denote the charged voltages of the nodes chg1, chg2, ..., chgn, respectively. After the discharge time $\Delta t$ has elapsed, the remaining nodes trg1, trg2, ..., and trgn are discharged.

When operation of the pump circuit is restarted, for example, when the flash memory device starts a write operation, the pump enable signal is activated, so that the gate voltage DIS1 and the gate voltage DIS2, which are supplied from the discharge control circuit and the delay circuit, respectively, to the discharge transistor outd and the discharge transistors trgd1, trgd2, ..., and trgdn, are transitioned from a voltage equal to or higher than Vcc, which turns the discharge transistors into a conductive state, to a voltage lower than Vcc, which turns the discharge transistors into a non-conductive state. As a result, the discharge transistors are in the non-conductive state. Thereafter, the clock signals are input from the clock driving circuit to the respective capacitors, and the voltage increasing operation is performed in a trouble free manner. In this case, it is not necessary to provide a time difference between a period during which the gate voltage DIS1 is output and a period during which the gate voltage DIS2 is output. The effects of embodiment 2 can be obtained so long as the gate voltage DIS1 and the gate voltage DIS2 are transitioned to such a voltage that turns the discharge transistors into the non-conductive state before the above clock signals reaches the respective capacitors.

As described above in detail, according to the present invention, during the time when a pump circuit is stopped, charges retained in nodes in the pump circuit are discharged so as to reduce stress on the pump circuit which may be caused due to a high voltage. As a result, operational reliability of a nonvolatile semiconductor storage device incorporating such a pump circuit is improved. With the above arrangement of the present invention, stresses imposed on the nodes, which may be caused in a conventional nonvolatile semiconductor storage device due to a high voltage required in write and erase operations, is reduced, whereby deterioration of the characteristics for read/write/erase operations on a memory cell is prevented. Thus, operational reliability of the nonvolatile semiconductor storage device can be improved.

Furthermore, a time difference is provided to timings of discharging the nodes so as to separate the discharge operation into multiple stages, whereby a load on a discharge circuit can be reduced. Thus, the size of the discharge circuit can be reduced, and accordingly, the size of the nonvolatile semiconductor storage device can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor storage device, comprising:
    a plurality of memory blocks, each of the memory blocks including,
        a memory array formed by a plurality of memory cells,
        a plurality of word lines and a plurality of bit lines, which are provided so as to cross each other and to be connected to the memory cells for selecting among the memory cells,
        a row decoder for selecting among the word lines according to an externally-input address, and
        a column decoder for selecting among the bit lines according to the externally-input address;
    at least one high voltage generation circuit for supplying a voltage which is required in writing data in or erasing data from the memory array, to the memory array through the row and column decoders,
    wherein the high voltage generation circuit is formed by a plurality of stages of basic pump cells, each of the basic pump cells including,
        a voltage increasing capacitor for increasing a voltage,
        an equalizing transistor which is connected to a voltage of a previous basic pump cell stage,
        a capacitor for increasing a voltage at a gate of the equalizing transistor, and
        a transistor which connects the voltage of the previous basic pump cell stage to the gate of the equalizing transistor,
    the nonvolatile semiconductor storage device further comprises,
        a discharge circuit connected to a node in the high-voltage generation circuit which has a high voltage, for discharging the node to a potential equal to or lower than a power supply voltage when the high-voltage generation circuit is stopped, and
        a control circuit for controlling the discharge circuit.

2. A nonvolatile semiconductor storage device according to claim 1, wherein the discharge circuit is connected to a junction point between a drain of the equalizing transistor and one electrode of the voltage increasing capacitor, and connected to a gate electrode of the equalizing transistor.

3. A nonvolatile semiconductor storage device according to claim 2, wherein the discharge circuit is connected to an output section of the high-voltage generation circuit.

4. A nonvolatile semiconductor storage device according to claim 3, wherein the control circuit controls a plurality of discharge circuits simultaneously.

5. A nonvolatile semiconductor storage device according to claim 3, wherein:
   the control circuit includes a delay circuit for delaying a control signal which is used for controlling the discharge circuit; and
   the control circuit controls the discharge circuit connected to the gate electrode of the equalizing transistor according to an output signal from the delay circuit.

6. A nonvolatile semiconductor storage device according to claim 2, wherein the control circuit controls a plurality of discharge circuits simultaneously.

7. A nonvolatile semiconductor storage device according to claim 1, wherein the discharge circuit is connected to the gate electrode of the equalizing transistor.

8. A nonvolatile semiconductor storage device according to claim 7, wherein the discharge circuit is connected to an output section of the high-voltage generation circuit.

9. A nonvolatile semiconductor storage device according to claim 8, wherein the control circuit controls a plurality of discharge circuits simultaneously.

10. A nonvolatile semiconductor storage device according to claim 8, wherein:
    the control circuit includes a delay circuit for delaying a control signal which is used for controlling the discharge circuit; and
    the control circuit controls the discharge circuit connected to the gate electrode of the equalizing transistor according to an output signal from the delay circuit.

11. A nonvolatile semiconductor storage device according to claim 7, wherein:
    the control circuit includes a delay circuit for delaying a control signal which is used for controlling the discharge circuit; and
    the control circuit controls the discharge circuit connected to the gate electrode of the equalizing transistor according to an output signal from the delay circuit.

12. A nonvolatile semiconductor storage device according to claim 1, wherein the discharge circuit is connected to an output section of the high-voltage generation circuit.

13. A nonvolatile semiconductor storage device according to claim 12, wherein the control circuit controls a plurality of discharge circuits simultaneously.

14. A nonvolatile semiconductor storage device according to claim 12, wherein:
    the control circuit includes a delay circuit for delaying a control signal which is used for controlling the discharge circuit; and
    the control circuit controls the discharge circuit connected to the gate electrode of the equalizing transistor according to an output signal from the delay circuit.

15. A nonvolatile semiconductor storage device according to claim 1, wherein the control circuit controls a plurality of discharge circuits simultaneously.

16. A nonvolatile semiconductor storage device according to claim 1, wherein:
    the control circuit includes a delay circuit for delaying a control signal which is used for controlling the discharge circuit; and
    the control circuit controls the discharge circuit connected to the gate electrode of the equalizing transistor according to an output signal from the delay circuit.

* * * * *